United States Patent [19]

Cline

[11] Patent Number: 4,492,739
[45] Date of Patent: Jan. 8, 1985

[54] EUTECTIC FINE WIRE ARRAYS

[75] Inventor: Harvey E. Cline, Schenectady, N.Y.

[73] Assignee: General Electric Company, Schenectady, N.Y.

[21] Appl. No.: 558,125

[22] Filed: Dec. 5, 1983

Related U.S. Application Data

[62] Division of Ser. No. 320,995, Nov. 13, 1981.

[51] Int. Cl.³ .......................... C22B 9/00; C22B 61/00
[52] U.S. Cl. ..................................... 428/611; 350/1.7;
 204/129.1; 204/129.5; 204/129.85; 204/129.95
[58] Field of Search ............... 428/611; 350/1.7, 162;
 204/130, 129.1, 129.5, 129.85, 129.95; 156/656

[56] References Cited

U.S. PATENT DOCUMENTS

| | | | |
|---|---|---|---|
| 3,484,153 | 12/1969 | Hunt et al. | 350/162 |
| 3,542,453 | 11/1970 | Kantor | 204/130 |
| 3,671,102 | 6/1972 | Clawson | 350/1.7 |
| 4,349,621 | 9/1982 | Cline | 428/610 |

FOREIGN PATENT DOCUMENTS 1500208 2/1978 United Kingdom ................ 427/53

OTHER PUBLICATIONS

Albers; W. et al., J. Crystal Growth, 18, 147–150, 1973.
Hauser; L. A., *The Iron Age,* 48–54, Jan. 20, 1944.
Dhindau; B. K. et al., Conference on In Situ Composites III, 60–68, 1979.

*Primary Examiner*—Veronica O'Keefe
*Attorney, Agent, or Firm*—Paul E. Rochford; James C. Davis, Jr.; James Magee, Jr.

[57] ABSTRACT

Arrays of substantially parallel metallic wires of micron and sub-micron dimensions are made by directionally solidifying the components of a eutectic alloy system as a thin film and subsequently removing at least one of the phases. The arrays are useful, for example, as conductors in microelectronic devices and as diffraction gratings for electromagnetic and ultrasonic waves.

7 Claims, 12 Drawing Figures

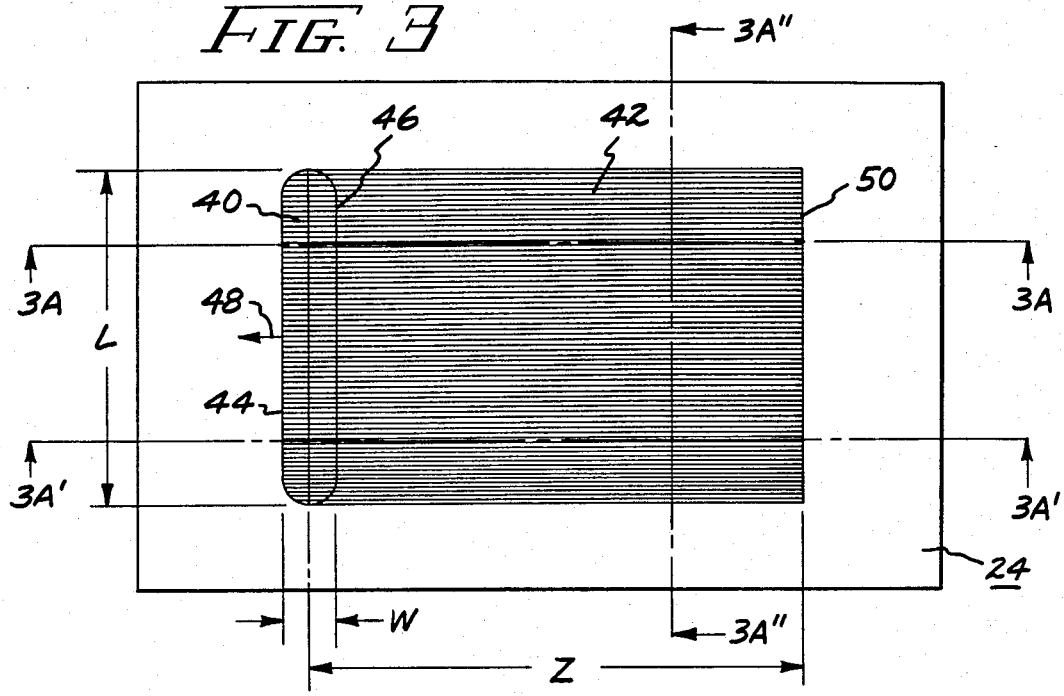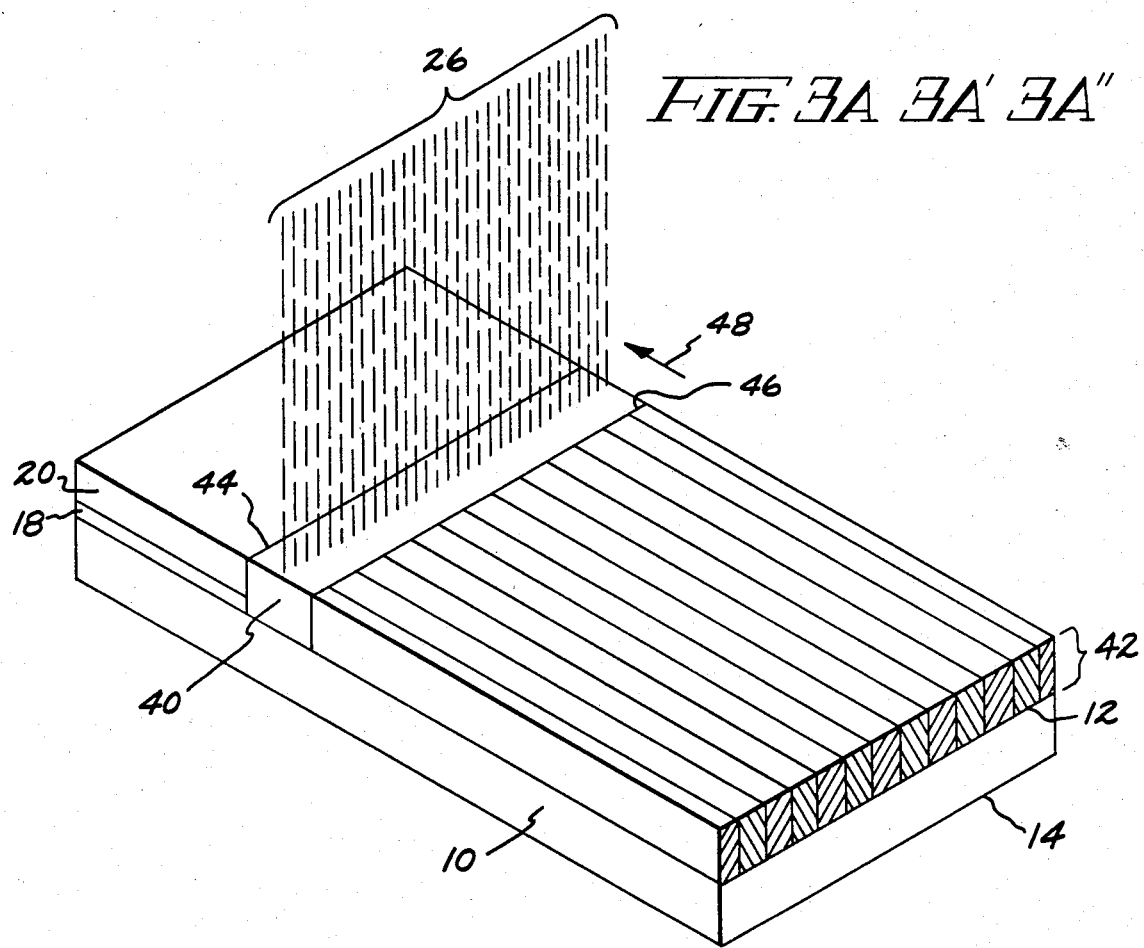

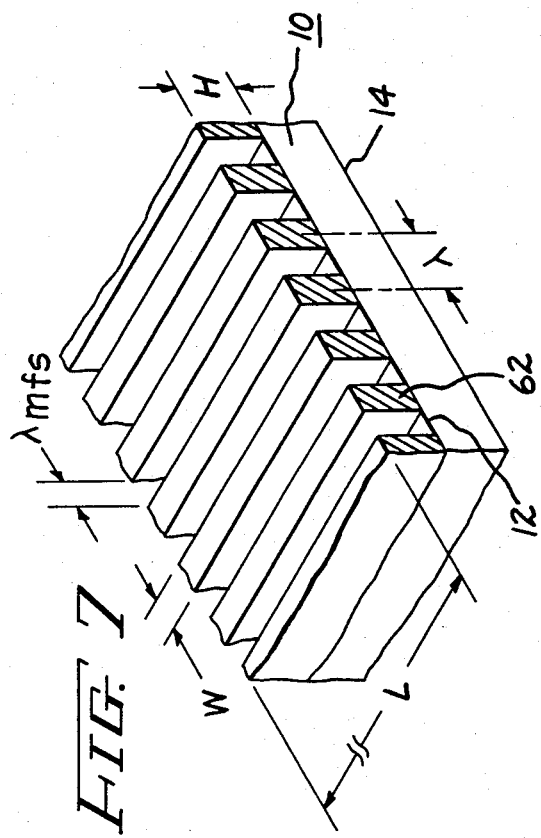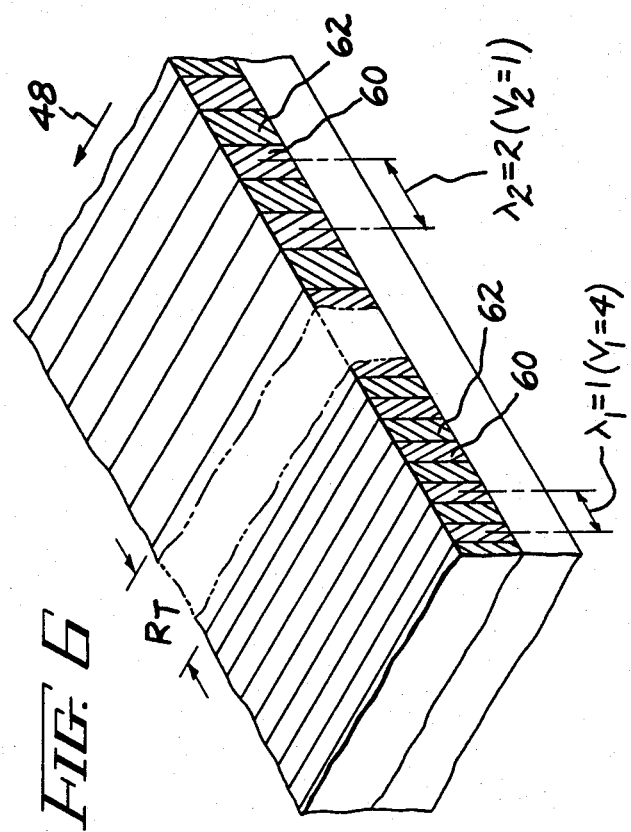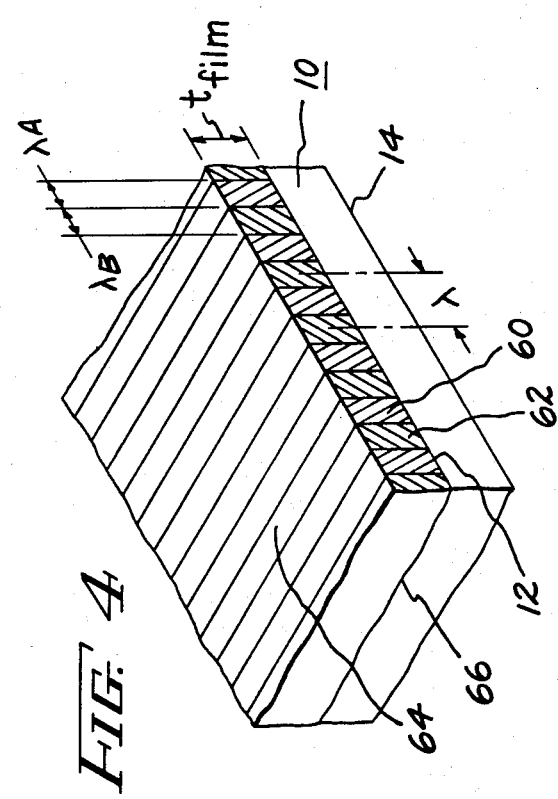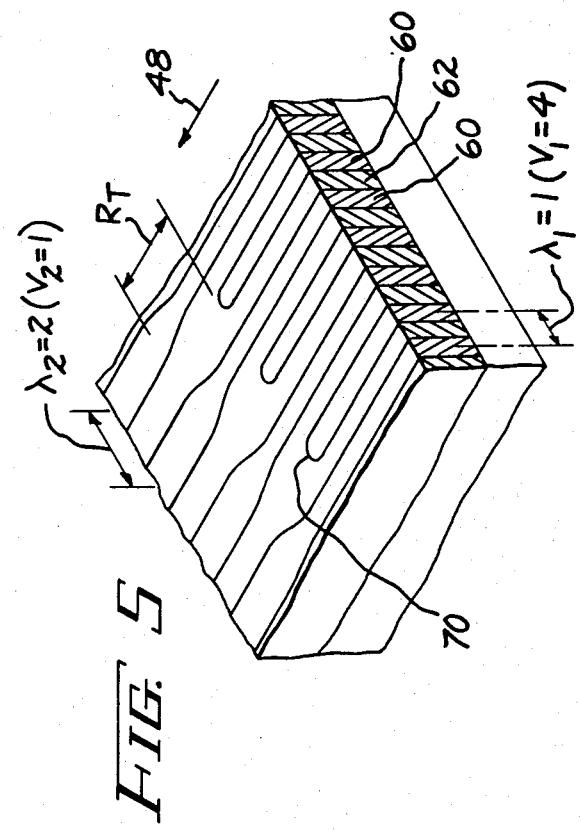

EUTECTIC FINE WIRE ARRAYS

This application is a division of application Ser. No. 320,995, filed Nov. 13, 1981.

The present invention relates to a method for producing arrays of substantially parallel metallic wires of micron and sub-micron dimensions which are useful, for example, as conductors in microelectronic devices and as diffraction gratings for electromagnetic and ultrasonic waves.

The invention herein is related to the inventions disclosed and claimed in U.S. Patent applications Ser. No. 245,764, filed Mar. 20, 1981, for "Method for Producing Eutectics as Thin Films" and Ser. No. 253,985, filed Apr. 13, 1981, now U.S. Pat. No. 4,349,621 issued on Sept. 14, 1982 for "Process for X-Ray Microlithography Using Thin Film Eutectic Masks" which were both filed in the name of Cline, are assigned to the same assignee as the instant application, and are herein incorporated by reference.

Microelectronics technology in general, and integrated circuit technology in particular, has experienced a period of extremely rapid growth during the past two decades. The mark of increased performance, measured principally by lower power requirements and higher speeds, has been decreased size of the microelectronic devices resulting from decreased size of the component parts or features such as the conductors (metallization) that interconnect the elements on a single substrate or chip.

The need and the search for improved devices having higher operating frequencies, lower power requirements, higher speeds and decreased cost continues. No doubt, those improved devices will be marked by a still further reduction in size led by reductions in the size of the component parts or features. An example of the benefits of reduced size may be found in surface acoustic wave devices which are useful, for example, in microwave generators, television tuners, and radar systems. By decreasing the line widths or spacing between the electrodes in the arrays that form the transducers that generate and detect surface waves from about 1 micron to about 0.1 micron, the operable frequency range may be increased from about 1000 MHz to about 10,000 MHz.

Thus, there is a need for devices having near-micron and sub-micron sized component parts and features and for methods by which those near-micron and sub-micron sized features can be produced reproducibly and inexpensively.

A method for producing arrays of substantially parallel metallic wires of near-micron and sub-micron dimensions is provided by this invention. The arrays are useful, for example, as conductors in microelectronic devices and as diffraction gratings for electromagnetic and ultrasonic waves. The process of the invention is relatively simple, rapid, and lower in cost compared to current pioneering processes utilizing electron beam equipment in the direct-write-on-the-wafer mode to fabricate sub-micron sized structures. Further, in sharp contrast to present day electron beam equipment operating in the above-described mode, the speed of the process of the invention increases as the structures become finer. Since the method of the invention produces the arrays directly, the use of intermediate materials, such as resists, and intermediate processing steps found in such conventional processing methods as photolithography are largely eliminated.

Briefly, and in its general aspects, the method of the invention comprises the steps of sequentially depositing the components of a eutectic alloy system as overlying thin planar layers on a substrate; creating a molten zone of the components bounded by the substrate and unmelted material of the components; moving the molten zone across at least a portion of the substrate to melt the components of the eutectic alloy at the leading edge of the zone, mixing the components in the zone, and freezing the components at the trailing edge of the zone in the form of a eutectic thin film of the eutectic composition having an aligned structure of at least two phases; and selectively removing at least one of the phases.

If the molten zone is moved at a uniform rate across the substrate, the resulting structure, briefly described, will be, for the case of a two phase lamellar eutectic, an array of substantially parallel lamellae, or wires, having the composition of the non-removed phase of the eutectic system separated by the width of the removed phase. If the rate at which the molten zone is moved across the substrate is varied, the size and spacing of the wires will vary along the direction in which the molten zone was moved resulting in a series of arrays. Alternatively, a plurality of parallel arrays of wires having different sizes and spacings may be made by moving a first zone across the substrate at a first rate to form a first array and subsequently moving a second zone through unmelted material parallel and adjacent to the previously melted material to form a second area.

The invention may be more readily and comprehensively understood from the more detailed description presented hereinbelow in connection with the accompanying drawings in which:

FIG. 3 is a schematic representation of the top surface of the preform of FIG. 1 partially converted to a eutectic thin film;

FIG. 3A is a dimensional view of the preform of FIG. 3 in partial cross-section taken along lines 3A—3A, 3A'—3A', and 3A"—3A" of FIG. 3;

FIG. 4 is a schematic dimensional view in partial cross-section of a lamellar thin film eutectic situate on a substrate;

FIG. 5 is a schematic dimensional representation of a portion of a preform solidified at two different sequential rates thus forming two eutectic fine wire arrays having different interlamellar spacings and lamellae of different widths in series with a transition region between the two arrays;

FIG. 6 is a schematic dimensional representation of a portion of a preform having two eutectic fine wire arrays with different interlamellar spacings and lamellae of different widths in a parallel relationship with a transition region between the two arrays;

FIG. 7 is a schematic dimensional representation of the structure of FIG. 4 following dissolution of one of the phases;

Figure 9:
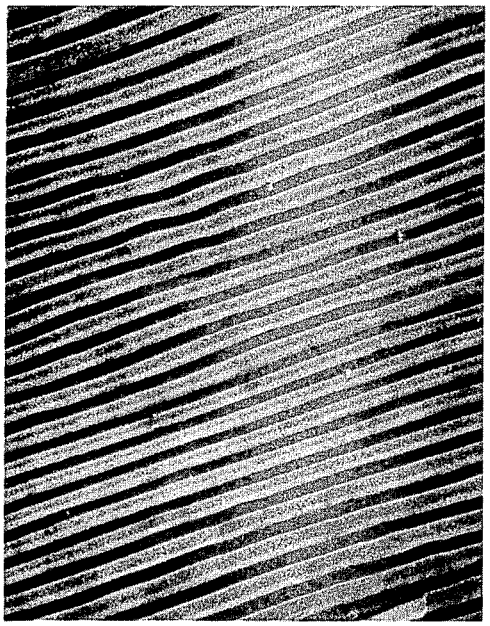
Figure 10:
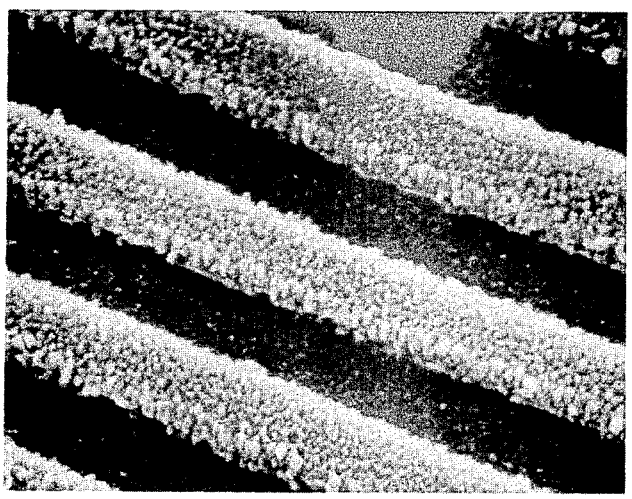
Figure 11:
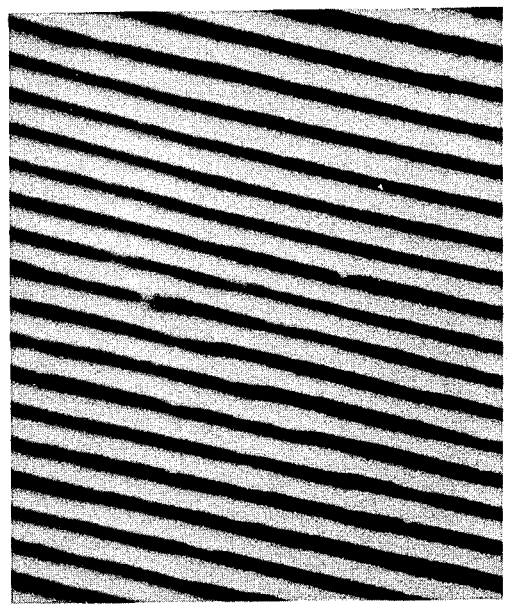

FIG. 9 is a scanning electron micrograph (2000X) of a eutectic fine wire array of the invention, tilted at about 30° to the electron beam, having wires of the aluminum-rich phase of the Al-CuAl$_2$ eutectic about 1.2 microns wide and an interlamellar spacing of about 2.4 microns;

FIG. 10 is a scanning electron micrograph of the eutectic fine wire array of FIG. 9 at 10,000X;

FIG. 11 is a scanning electron micrograph (10,000X) of a eutectic fine wire array of the invention, tilted at about 30° to the electron beam, having wires of the lead-rich phase of the lead-cadmium eutectic about 0.4 micron wide and an interlamellar spacing of about 0.6 micron.

In the practice of the invention, a eutectic alloy is first solidified as a thin film as described below in brief, but functional, detail and in greater detail in the above cross-referenced and incorporated Ser. No. 245,764 application and the paper "Directionally Solidified Thin-Film Eutectic Alloys" by H. E. Cline (Journal of Applied Physics, 52 (1), pp. 256–260, Jan. 1981) which is also incorporated herein by reference. Preferably, the eutectic alloy is one which can be solidified to form a lamellar structure, i.e., one having alternating plate-like regions whose compositions correspond substantially to the phases of the eutectic system. Although the present invention is not limited to binary systems, typical suitable binary systems include, for example, the lead-tin, lead-cadmium and aluminum-copper systems.

Figure 1:
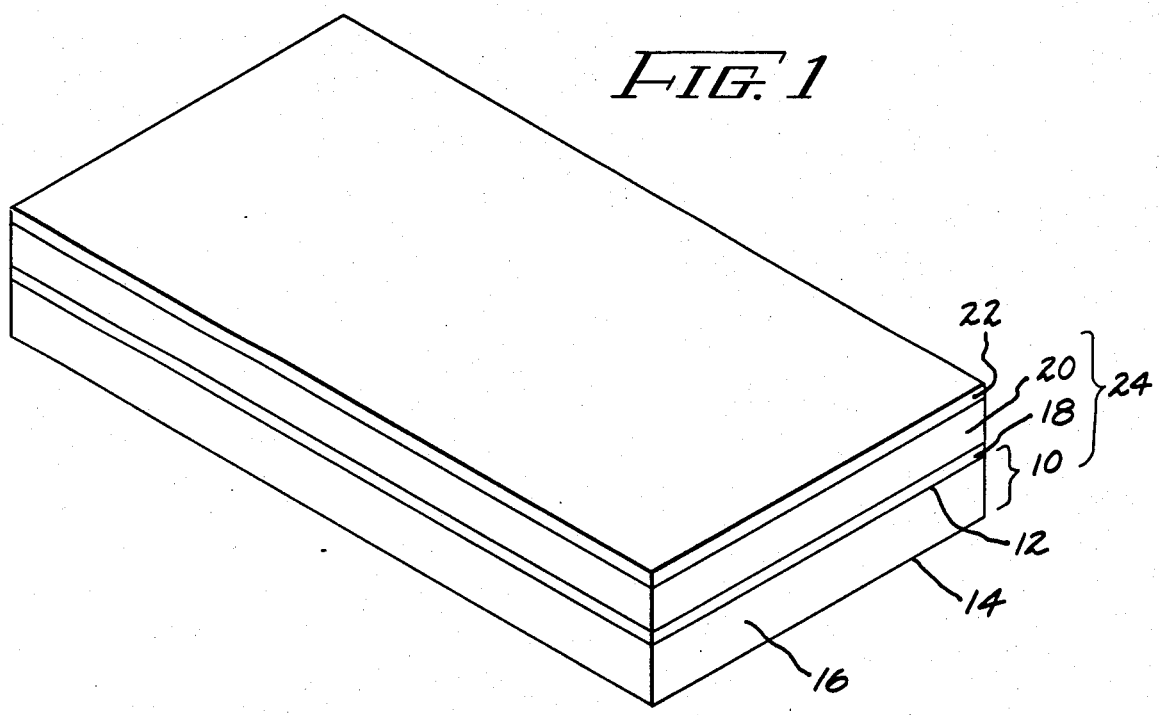
FIG. 1 is a schematic dimensional representation of a preform consisting of a substrate having two overlying planar layers of the two components of a binary eutectic system situate thereon with a planar cover layer over the eutectic components.

A substrate 10, shown schematically in FIG. 1, is provided. Suitable materials for substrate 10 include, for example, Pyrex ®, alumina, mica, silica, and other materials, such as silicon, which are useful in the manufacture of semiconductor devices. Generally, substrate 10 will have major opposed first or top 12 and second or bottom surfaces 14 and an outer peripheral edge area 16 interconnecting the major surfaces. Edge area 16 may define a circle or rectangle or other convenient shape. For heat flow considerations, surfaces 12 and 14 are preferably substantially parallel and optically flat, smooth, and free from dirt, lint, and other artifacts.

Next, the thicknesses of the materials, i.e., components, of the eutectic system are calculated, per unit area of either major surface 12 and 14 of substrate 10, as a ratio according to the following formula:

$$t_1\rho_1 W_1 = t_2\rho_2 W_2 = \ldots = t_n\rho_n W_n \qquad (1)$$

where
  $W_1$ = weight percent of component 1 in the eutectic
  $W_n$ = weight percent of the $n^{th}$ component in the eutectic
  $\rho_1$ = density of component 1
  $\rho_n$ = density of the $n^{th}$ component
  $t_1$ = thickness of the layer of component 1
  $t_n$ = thickness of the layer of the $n^{th}$ component
and converted to actual thicknesses by use of the formula:

$$t_{film} = t_{total} = t_1 + t_2 + \ldots + t_n \qquad (2)$$

For a binary system, equation (1) reduces to $$\frac{t_1}{t_2} = \frac{\rho_2 W_2}{\rho_1 (1 - W_1)} \qquad (3)$$

The calculational method shown above is more accurate than calculations from the phase diagram based on the so-called level rule and is, therefore, preferred.

The starting materials should be as pure as possible, preferably "4-9s" or purer, as impurities tend to disrupt the heat and mass balance of the solidifying eutectic during the subsequent processing described below thereby forming defects, e.g., faults. Contamination of substrate 10 and the materials of the eutectic is to be avoided. The practice of clean room conditions, such as are known to those skilled in the art of the manufacture of semiconductor devices, is preferable.

The eutectic materials and substrate 10 are transferred to suitable apparatus (not shown) for the evaporation and deposition of the materials onto substrate 10. In a vacuum, preferably less than or equal to $10^{-6}$ torr, the materials of the eutectic are evaporated and deposited sequentially in overlying planar layer-like fashion onto substrate 10. In FIG. 1 there is shown schematically layer 18 of a first component of a binary eutectic system deposited upon major surface 12 of substrate 10 and layer 20 of the second component deposited upon layer 18. Preferably, the thickness of each layer is within ±10% of that calculated with Equations (1) and (2), although for some eutectic systems the acceptable tolerance may be less than ±10%.

Optionally, cover layer 22, as shown in FIG. 1, may be provided on top of the deposited eutectic components. Cover layer 22 may be provided by depositing a refractory metal oxide subsequent to the deposition of the layers of the eutectic material or may be another piece of the same material as substrate 10 laid upon the deposited components. Cover layer 22 is desirable to prevent oxidation of the eutectic during subsequent processing. Oxidation may also be avoided by practicing the invention in a vacuum or inert atmosphere. With or without cover layer 22, a completed preform 24 has been fabricated at this stage.

Figure 2:
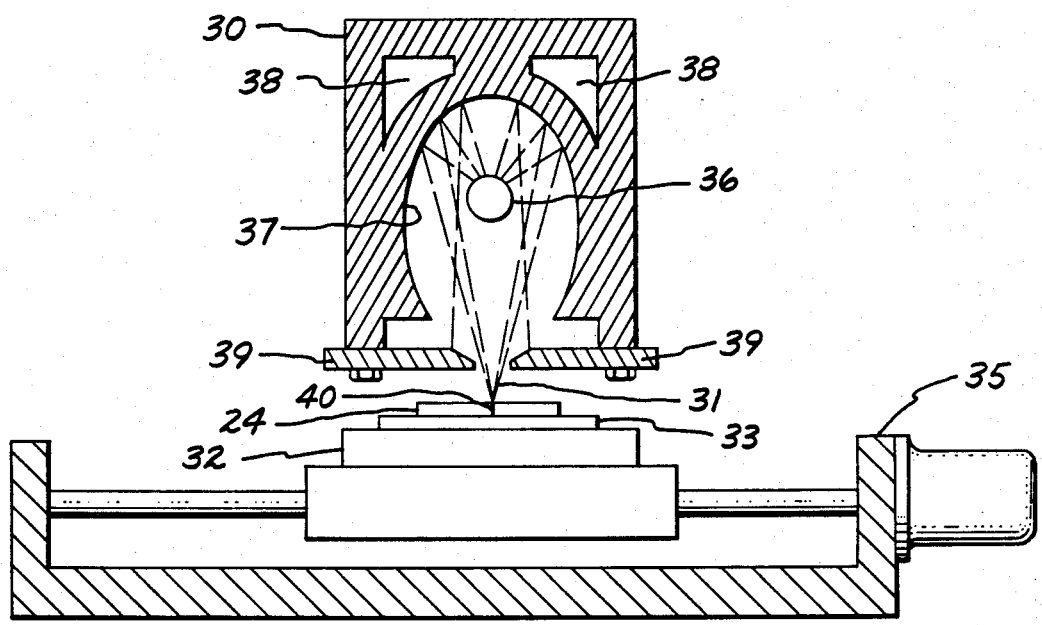
FIG. 2 is a schematic representation in cross-section of an apparatus, including a line heater, used to form a eutectic thin film on the preform of FIG. 1.

The prepared eutectic preform 24 is next placed in an apparatus, such as that shown schematically in FIG. 2, for the next steps in the preparation of a eutectic thin film. Typically, the apparatus of FIG. 2 consists of heat source 30 capable of projecting a beam of heat 31 onto preform 24, heat sink 32, which may be water cooled, optional thermal buffer plate 33, and means 35 for smoothly translating heat sink 32 and preform 24 mounted thereon beneath beam 31 at a determinable rate. Sufficient heat is applied from heat source 30 to form narrow molten zone 40 of width W and longitudinal length L, as shown in FIG. 3.

A line heater, such as that shown in FIG. 2, has been found to be an effective heat source 30 with suitable modifications including a line voltage regulator to minimize power fluctuations. One such line heater is that manufactured by Research, Inc. of Minneapolis, Minnesota (Catalogue #5215-10). The line heater of FIG. 2 consists primarily of lamp 36, such as a quartz or arc lamp, situate at the focal point of a polished aluminum elliptical reflector 37 which has cooling channels 38 therein. The commercial line heater was further modified by shutters 39 of highly polished aluminum which effectively intensify the thermal profile of beam 31 thus narrowing the width of zone 40 thereby increasing the thermal gradient in zone 40.

A laser is also a suitable, although more expensive, heat source 30 than the line heater. The narrower molten zone 40 created by a laser makes possible both higher thermal gradients and more rapid solidification rates in molten zone 40 and, consequently, eutectic thin films having thinner lamellae and narrow interlamellar spacings. Replacement of the line heater with a laser as heat source 30 requires means for spreading the beam into a line heat source. The use of optics to slowly scan or raster the laser beam across preform 24 has been found to result in objectionable surface perturbations. A simple non-mechanical solution is to provide a cylindrical lens in the path of the laser beam between the laser as heat source 30 and preform 24 to convert the circular beam into a thin line source of heat. It was found, however, that the beam intensity was not uniform along the length of the line when the lens system was used, i.e., there was a decrease in power at the ends compared to the center of the line of heat.

The laser beam may be scanned rapidly enough through the use of a lens-mirror system, such as a rotating polygonal mirror, to create a satisfactory line source of heat. A further advantage of the use of a laser as heat source 30 is that preform 24 may be kept stationary and molten zone 40 traversed across preform 24 by the use of additional optical scanning means. By keeping preform 24 stationary, it is possible to minimize disruption of the eutectic structure by external mechanical vibrations. The use of the rotating polygonal mirror, however, adds to the overall cost of the system and requires that the optical system be kept in perfect alignment.

As shown in FIG. 3A, molten zone 40 will be coextensive with at least a portion of substrate 10 and cover layer 22, if cover layer 22 is present. If cover layer 22 is not present, molten zone 40 will rest on at least a portion of substrate 10 and will be otherwise bounded by the unmelted eutectic material layers 18 and 20 and solidified thin film eutectic 42 on preform 24. By operating means 35, preform 24 is traversed beneath the stationary heat source thereby, in effect, moving molten zone 40 across preform 24. As molten zone 40 traverses preform 24, the component layers 18 and 20 of the eutectic are melted at leading edge 44 of zone 40, mixed together in zone 40, and solidified at trailing edge 46 of zone 40 in the desired eutectic pattern 42. After the desired amount of material has been melted and solidified, the traversing motion of means 35 is stopped and heat source 30 is turned off whereupon molten zone 40 freezes in situ. In FIG. 3, molten zone 40 is shown after traversing a distance Z, in the direction of arrow 48 from starting location 50.

FIG. 4 is a schematic representation of the structure of solidified eutectic 42 viewed perpendicular to cutting plane 3A"—3A" of FIG. 3 and is typical of the two phase thin film lamellar eutectics made by the method described above. The interlamellar spacing, $\lambda$, defined as the distance between the center of one lamella to the center of the nearest adjacent lamella of the same type, is shown in FIG. 4 as are the widths $\lambda_A$ and $\lambda_B$ of lamella 60 and 62, respectively, and the resultant film thickness, $t_{film}$. The widths of the lamellae and the interlamellar spacing is principally a function of the rate at which zone 40 is traversed across substrate 10. The ratio of the widths of the lamellae is substantially constant and may be determined from the phase diagram in accordance with the well-known lever rule principle. Generally, the thickness of the resultant film, $t_{film}$, is equal to the sum of the thicknesses of the component layers. The lamellae extend between and terminate in the substantially parallel and generally planar top 64 and bottom 66 surfaces of the thin film. The center lines of the lamellae are substantially parallel to the thickness dimension, i.e., the lamellae intersect top 64 and bottom 66 surfaces of the thin film at substantially right angles.

As noted briefly above, the interlamellar spacing $\lambda$ is a function of the growth, i.e., solidification, rate and generally follows the empirical relationship $$\lambda^2 V = \text{constant} \tag{4}$$

where V equals the growth rate. Generally, the growth rate is equal to the rate at which molten zone 40 is traversed across preform 24. By varying the growth rate during the course of traversing molten zone 40 across preform 24, a thin film eutectic having adjacent regions with different lamellar spacings in series may be produced. Such a structure is shown schematically in FIG. 5 for a binary eutectic where a single change in growth rate has been made. In the case shown in FIG. 5, the growth rate has decreased in the direction of arrow 48 by a factor of 4 resulting in a factor of 2 increase in interlamellar spacing. As is also shown in FIG. 5, the initially "fault-free" structure makes a "smooth" transition across transition region $R_T$, i.e., alternate lamellae 60 of one phase of the binary eutectic terminate in faults 70 and the alternate non-faulted lamellae of the same phase grow smoothly and uniformly to the new size dictated by relationship of equation (4) and the phase diagram for the alloy involved. Viewed in the direction opposite to that of arrow 48 of FIG. 5, the lamellae 62 of the other phase are seen to smoothly "branch" across transition region $R_T$. Smooth transitions are usually observed when $\lambda$ and V are integer values. The transition region will be more irregular and more extensive when non-integer values rather than integer values are involved. The length of region $R_T$ (in the direction parallel to arrow 48) is primarily a function of the thermal lag of the mechanical system, whether or not the change in V is made gradually or abruptly, and the geometry of the eutectic phases.

An alternative variably spaced structure wherein adjacent regions with different interlamellar spacings are in parallel is shown schematically in FIG. 6. The structure of FIG. 6 would be produced by directionally solidifying a first array or region with a first interlamellar spacing, $\lambda_1$, in the direction of arrow 48. A second array, or region, parallel and adjacent to the first region would then be solidified at a different solidification rate, again in the direction of arrow 48, thereby producing a second region with a second interlamellar spacing $\lambda_2$. In this case, the nature and quality of the structure in the transition region, $R_T$, will be a function of, for example, the sharpness of the thermal gradients in molten zone 40. Ideally, the transition region would be a sharp boundary between the two regions which were solidified at different rates, $V_1$ and $V_2$. Although only a single change in the solidification rate is shown in FIGS. 5 and 6, it should be recognized that the solidification rate may be varied so that a plurality of structures of different interlamellar spacing are produced either in series or in parallel.

It has been discovered that one of the phases of the eutectic alloy may be selectively removed by chemical dissolution, or other means such as reactive ion etching, leaving behind an array of substantially parallel metallic wires of micron and sub-micron dimensions useful, for example, as conductors in microelectronic devices and as diffraction gratings for electromagnetic and ultrasonic waves. Removal may be accomplished by immersing the solidified eutectic thin film in a chemical solution, preferably with agitation of the solution. Electrochemical dissolution may also be employed to selectively remove one of the phases. In the electrochemical method, the thin film is made the anode and placed opposite an electrode of an inert material of opposite polarity. The electrochemical solution may be agitated or caused to flow against the thin film as in the electropolishing process.

The resultant structure, an array of substantially parallel wires is shown schematically in FIG. 7. As used herein, the term "wire" refers to a structure which is substantially, but not necessarily, rectangular or square in cross-section and, as shown below, may be substantially smooth and regular in appearance or may be rough depending, for example, on the degree of attack by the dissolution medium and the magnification at which the wires are observed. Thus, when used in conjunction with this invention, the term "wire" is intended to include a metallic unit of whatever cross-sectional geometry whose length is long in comparison to its height (H) or width (W) (at least 100:1), having a composition substantially equal to the terminal solid solution of at least one phase of a eutectic alloy system and remaining after the dissolution of at least one other phase of the eutectic alloy formed as a thin (less than or equal to about 8 microns) film. If the wires are of non-rectangular cross-section, then their width (W) will be measured as the largest dimension on a plane parallel to the plane of substrate 10. Likewise, the term "array" refers to at least a pair of the wires in a substantially mutually parallel relationship and defining a gap or empty space inbetween.

Since the phases of the eutectic thin film may not have a volume relationship equal to or close to 1:1, FIG. 7 includes the terminology of "Minimum Feature Size", $\lambda_{mfs}$, sometimes referred to by the practitioners of the semiconductor arts. The minimum feature size is defined as the smallest feature of a pattern or a lithographic mask. The interlamellar spacing, $\lambda$, and the minimum feature size, $\lambda_{mfs}$, will be substantially equal only when the eutectic phases are present on a 1:1 basis. In FIG. 7, where lamellae 62 and the gaps therebetween are approximately equal, $\lambda_{mfs}$ has been chosen as the distance or gap between substantially parallel wires 62 for purposes of illustration. When referring to the arrays of wires made by the method of this invention, it may be convenient to refer to the interlamellar spacing, $\lambda$, as the interwire spacing ($\lambda_{iws}$).

The fine wire array structure of FIG. 7 is useful, for example, as a conductor array for the interconnections of elements on a single semiconductor chip. On an optically transparent substrate the structure of constant period ($\lambda_{iws}$) of FIG. 7 is also useful as a diffraction grating. Since the spacing between the wires can be made in the near-micron and sub-micron range, and varied by varying the rate at which the eutectic is solidified, the gratings of the invention are particularly useful in the ultraviolet region of the electromagnetic spectrum. On a substrate which is transparent to X-radiation, the gratings of FIG. 7 of the invention are particularly suited for use as masks in X-ray lithography as described in more detail in the above cross-referenced and incorporated Ser. No. 253,985 application and the paper, "Submicron-Resolution Eutectic Thin Film Mask" by H. E. Cline in Applied Physics Letters (37 (12), Dec. 15, 1980, pp. 1098–1101) which is herein incorporated by reference.

Similarly, by the method of the invention, the structures of FIGS. 5 and 6 may be made as arrays of wires having the appearance of the phase remaining, e.g., lamellae 60, after the other phase, lamellae 62, has been selectively removed. The multiple array structures of FIGS. 5 and 6 generically describe diffraction gratings for electromagnetic or acoustic waves. More particularly, lamellae 60 (or 62, depending upon which phase is selectively removed) of FIG. 5 are in the configuration of a spectrum analyzer and lamellae 60 (or 62, depending upon which phase is selectively removed) of FIG. 6 are in the configuration of a filter. The unique nature of the transition region, $R_T$, of the structure of FIG. 5 renders it difficult, if not impossible, to produce using standard techniques and so-called ruling engines.

The following Examples are provided by way of illustration, and not by way of limitation, to further instruct those skilled in the art of the manner of practice of the invention.

EXAMPLE I

Several preforms of the Al-CuAl$_2$ eutectic alloy system (33.2 wt. % Cu) were made by depositing layers of Cu and Al on a Pyrex ® substrate with an electron beam evaporator in a vacuum of $10^{-6}$ Torr at a rate of 20 Angstroms/sec. During evaporation, the thicknesses of the layers were monitored to give 2580Å thick copper layer and a 17420Å thick aluminum layer. These thicknesses were calculated by equation (3) to give a 2 micron thick thin film of the eutectic composition.

A first set of three preforms was directionally solidified at 0.0016 and 0.0042 cm/sec using the line heater means described above equipped with a quartz iodine lamp having a beam focused to provide a 3 mm wide line of heat and a substantially equally wide molten zone.

With the line heater means, the thermal gradient in the molten zone was insufficient to yeild aligned lamellar structures at solidification rates greater than about 0.0042 cm/sec. Therefore, the remaining preforms were solidified using laser beam means wherein the heat from a 90 watt (Continuous Wave) Nd:YAG laser was focused with a 50 mm focal length cylindrical lens to a 0.02 cm wide line forming a substantially equally wide molten zone.

Figure 8:
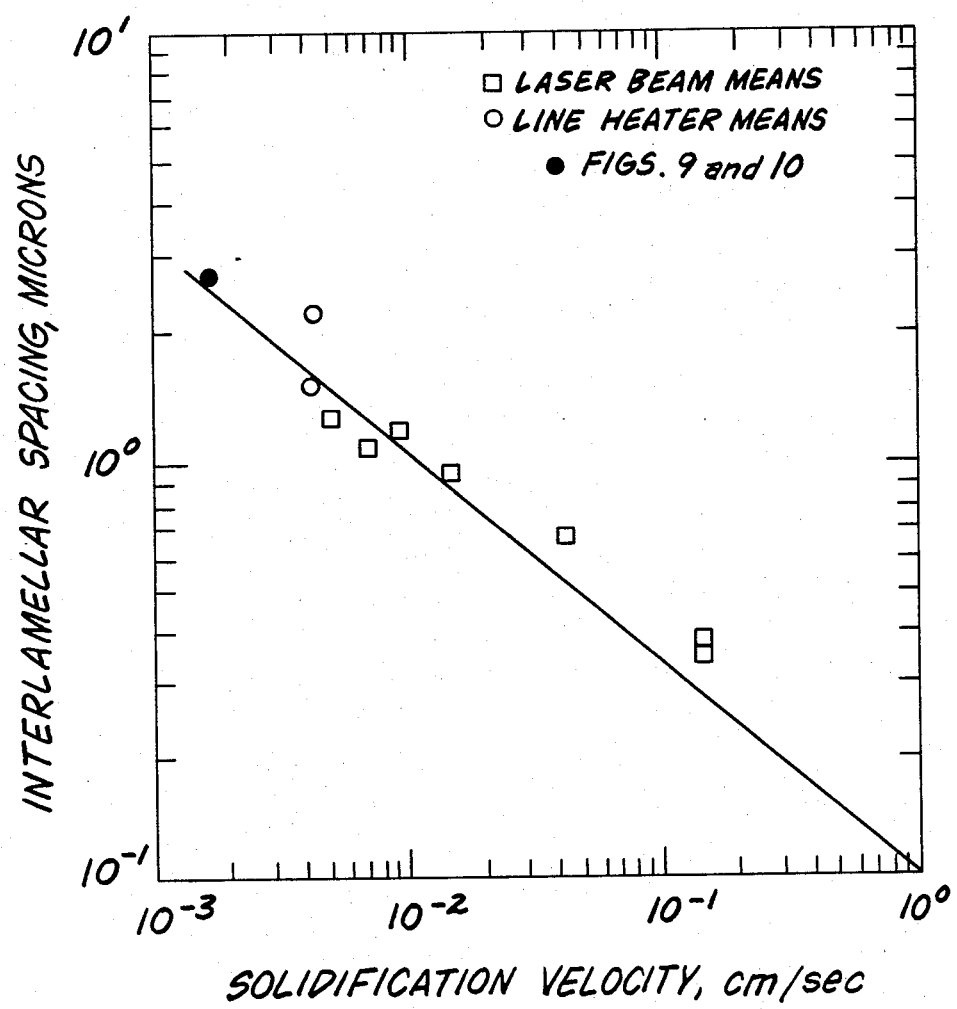
FIG. 8 is a graph of the interlamellar spacing of thin films of the Al-CuAl$_2$ eutectic system as a function of solidification velocity.

The width of the aluminum-rich phase ($\alpha$) was equal to the width of the CuAl$_2$ phase ($\theta$); consequently, the Al-rich wires were one-half as wide as the interlamellar spacing. A graph of lamellar spacing as a function of the growth or solidification velocity is shown in FIG. 8, and is described by the equation $$\lambda = B(V)^{-\frac{1}{2}} \qquad (5)$$

where the constant $B = 8.4 \times 10^{-6} \text{cm}^{3/2}\text{sec}^{-\frac{1}{2}}$. The scatter in the interlamellar spacing is attributed to local fluctuations in the solidification velocity or in the constancy of the heat flow.

The CuAl$_2$ phase was selectively removed by electropolishing the films solidified at 0.0016 cm/sec in a Disa Electropol Type 53 apparatus in the flowing solution of 62 ml perchloric acid, 137 ml water, 700 ml ethanol, and 100 ml butycellosolve. The electropolishing process was conducted at 35 volts direct current (DC) for 4 seconds at room temperature with the thin film as the anode and a stainless steel cathode of approximately the same surface area as the film situated opposite the thin film and separated by about 10 mm from the film.

The resulting structure of the array of aluminum-rich (α-phase) wires of the film solidified at 0.0016 cm/sec is shown in the FIG. 9 scanning electron micrograph at 200X wherein the array is tilted at about 30° to the beam to enhance contrast. Measurements on untilted specimens showed that the wires were substantially rectangular in cross-section and were about 1.2 microns wide by about 2 microns high and that the interlamellar spacing was about 2.4 microns. As may be observed in the FIG. 10 scanning electron microscope at 10,000X of the same general area as FIG. 9, some etching of the Al-rich phase has occurred which resulted in surface roughening of the Al-rich wires.

Transmission electron microscopy of the as-solidified eutectic thin film demonstrated that the interphase boundary between the Al-rich phase and the $CuAl_2$ phase was planar and oriented normal to the plane of the film. Selective area electron diffraction was used to identify the phases and showed that the fine wires were single crystals. Single crystals are advantageous for use as metallization at submicron dimensions to minimize electromigration and improve thermal stability.

Measurements of the preforms solidified at 0.14 cm/sec indicated that the lamellae of both phases were about 0.16 micron wide and the interlamellar spacing was about 0.33 micron. Ultimately, the minimum feature size of the arrays of wires of the aluminum-copper eutectic system that may be obtained by the method of this invention is about 100Å which is that reported in the literature for a splat cooled thin foil of the Al-$CuAl_2$ eutectic. At solidification rates more rapid than those found in splat cooling, the eutectic alloy liquid was reported to transform to a single non-equilibrium solid solution.

EXAMPLE II

Using the equipment and techniques described above in Example I, additional preforms of the Al-$CuAl_2$ eutectic system were prepared and solidified at 0.0042 cm/sec. Whereas the thicknesses of the layers of aluminum and copper of Example I were maintained to yield a resultant thin film of nearly exact eutectic composition (33.2 wt. % Cu), the thicknesses of the layers of aluminum and copper of this Example were varied to yield thin films having 34.9, 33.9, 32.0, and 31.0 weight percent copper. Those preforms having 34.9 and 31.0 weight percent copper solidified to form dendritic structures whereas those preforms having 33.9 and 32.0 weight percent copper solidified to form substantially uniform lamellar structures. Thus, the thicknesses of the layers of the components of the Al-$CuAl_2$ eutectic system may vary such that the composition of the resultant thin film is within about ±2.0 percent of the eutectic composition and still be solidified to form lamellar thin film eutectic structures.

EXAMPLE III

Using the same general procedure and equipment of Example I, a 5320Å thick layer of cadmium and a 15,680Å thick layer of lead were sequentially deposited on a Pyrex ® substrate in a vacuum of $10^{-6}$ Torr and directionally solidified at 0.0042 cm/sec.

The resultant lead-cadmium eutectic (17.4 wt. % Cd) thin film was electropolished using the pump from the Disa apparatus to pump a solution of 1% perchloric acid in methanol through a hypodermic syringe. The needle of the syringe as the cathode was traversed back and forth across a selected area of the anodic thin film at a distance of about 4 cm at a direct current potential of about 150 volts between the two. The structure was observed periodically through a microscope and the electropolishing was continued until the lamellae of the cadmium-rich phase were removed from between the lamellae of the lead-rich phase in the selected area. The resultant array having lead-rich wires about 0.42 micron wide and an interlamellar spacing of about 0.57 micron is shown in the 10,000X scanning electron micrograph of FIG. 11 wherein the array is tilted at about 30° to the beam to enhance contrast. Alternatively, it has been found that dissolution of the cadmium-rich wires can be accomplished by simple immersion in a 1% solution of Nital (1 ml $HNO_3$ in 99 ml ethyl alcohol).

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A eutectic fine wire array comprising a plurality of substantially mutually parallel wires situated on a substrate, said wires having a composition substantially corresponding to at least one phase of a eutectic alloy system, an interwire spacing $\lambda_{iws}$ and width W measured along a plane parallel to the plane of said substrate.

2. The eutectic fine wire array of claim 1 wherein said composition of said wires corresponds substantially to the aluminum-rich phase of the Al-$CuAl_2$ eutectic system.

3. The eutectic fine wire array of claim 2 wherein said interwire spacing $\lambda_{iws}$ is characterized by the formula $$\lambda_{iws} = B(V)^{\frac{1}{2}}$$

where $B = 8.4 \times 10^{-5}$ $cm^{3/2}sec^{-\frac{1}{2}}$ and V is the rate at which said eutectic fine wire array was solidified.

4. The eutectic fine wire array of claim 1 wherein the material of said substrate is one selected from the group consisting of glass, mica, silicon, and alumina.

5. The eutectic fine wire array of claim 1 wherein said composition of said wires corresponds substantially to the lead-rich phase of the lead-cadmium eutectic system.

6. The eutectic fine wire array of claim 5 wherein said wires have an interwire spacing of about 0.57 micron and each side wire is of substantially rectangular cross-section of width W of about 0.42 micron.

7. The eutectic fine wire array of claim 6 wherein the material of said substrate is one selected from the group consisting of glass, mica, silicon, and alumina.

* * * * *